United States Patent
Harada et al.

(10) Patent No.: US 9,601,186 B2
(45) Date of Patent: Mar. 21, 2017

(54) BIT LINE PRECHARGING CIRCUIT, STATIC RAM, ELECTRONIC DEVICE, AND STATIC RAM BIT LINE PRECHARGING METHOD

(71) Applicant: Socionext Inc., Yokohama-shi, Kanagawa (JP)

(72) Inventors: Shunsuke Harada, Kawasaki (JP); Morimi Arita, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/951,042

(22) Filed: Nov. 24, 2015

(65) Prior Publication Data

US 2016/0211013 A1    Jul. 21, 2016

(30) Foreign Application Priority Data

Dec. 11, 2014    (JP) .................................. 2014-251204

(51) Int. Cl.
| | | |
|---|---|---|
| *G11C 11/40* | (2006.01) | |
| *G11C 11/419* | (2006.01) | |
| *G11C 7/12* | (2006.01) | |
| *G11C 5/14* | (2006.01) | |
| *G11C 11/401* | (2006.01) | |
| *G11C 11/24* | (2006.01) | |

(52) U.S. Cl.
CPC .............. *G11C 11/419* (2013.01); *G11C 7/12* (2013.01); *G11C 5/147* (2013.01); *G11C 11/24* (2013.01); *G11C 11/40* (2013.01); *G11C 11/401* (2013.01)

(58) Field of Classification Search
CPC ........... G11C 5/142; G11C 7/12; G11C 11/24; G11C 11/40; G11C 11/401; G11C 11/419
USPC ............................. 365/154, 185.25, 194, 203
See application file for complete search history.

(56) References Cited

U.S. PATENT DOCUMENTS

| | | | | |
|---|---|---|---|---|
| 4,712,194 A | * | 12/1987 | Yamaguchi ........... | G11C 11/419 365/154 |
| 5,790,466 A | * | 8/1998 | Hotta ..................... | G11C 16/26 365/185.25 |
| 6,947,342 B2 | | 9/2005 | Ishida et al. | |
| 8,947,968 B2 | * | 2/2015 | Chen .................... | G11C 11/417 365/203 |
| 2015/0098267 A1 | * | 4/2015 | Jain .......................... | G11C 7/12 365/154 |

FOREIGN PATENT DOCUMENTS

| | | |
|---|---|---|
| JP | H08-339668 A | 12/1996 |
| JP | H10-055676 A | 2/1998 |
| JP | 2003-016785 A | 1/2003 |

* cited by examiner

*Primary Examiner* — Tan T. Nguyen
(74) *Attorney, Agent, or Firm* — Arent Fox LLP

(57) ABSTRACT

A bit line precharging circuit includes a first switch that connects a bit line to a first power source, a second switch that connects the bit line to a second power source whose voltage value is higher than voltage value of the first power source, and a control circuit including a delay element and configured to bring the second switch into conduction after a delay time by the delay element after bringing the first switch into conduction at the time of precharge of the bit line.

8 Claims, 7 Drawing Sheets

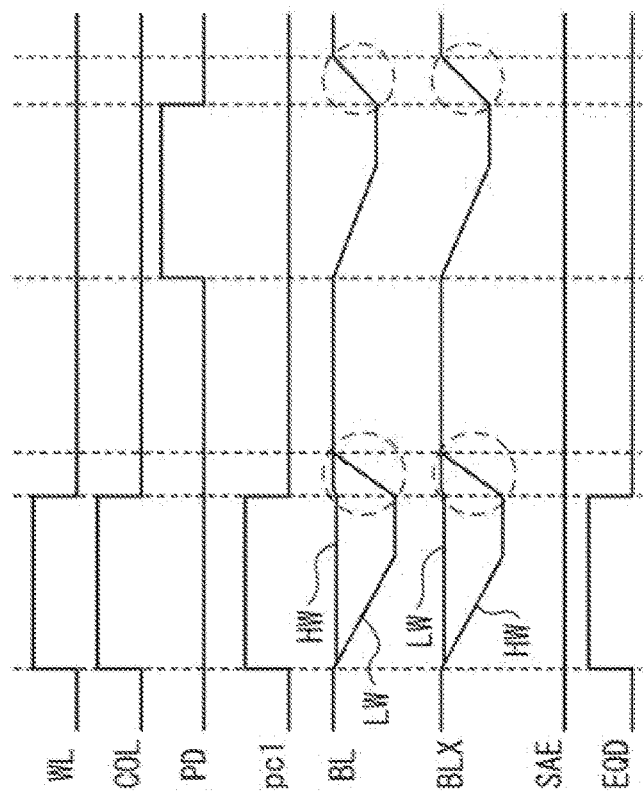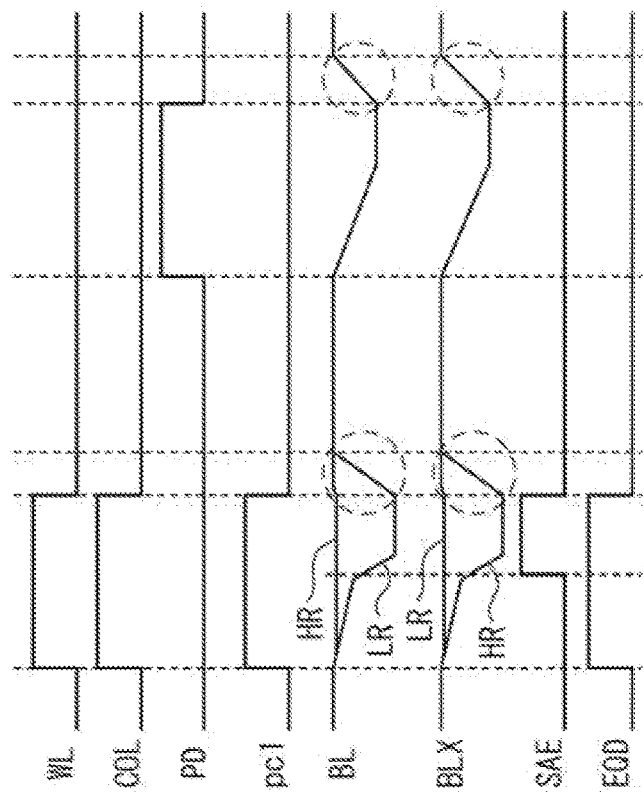

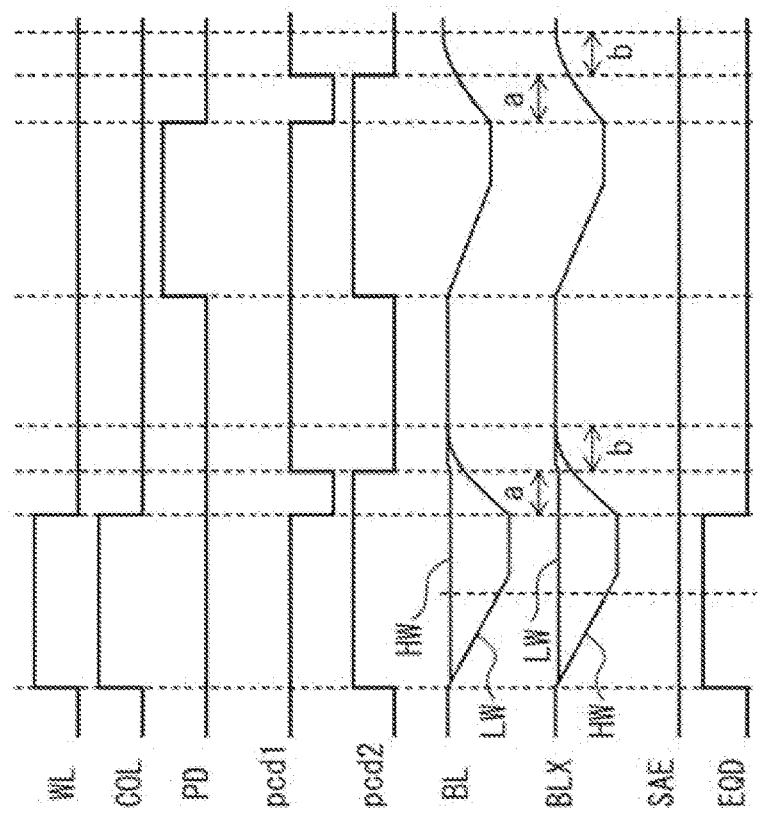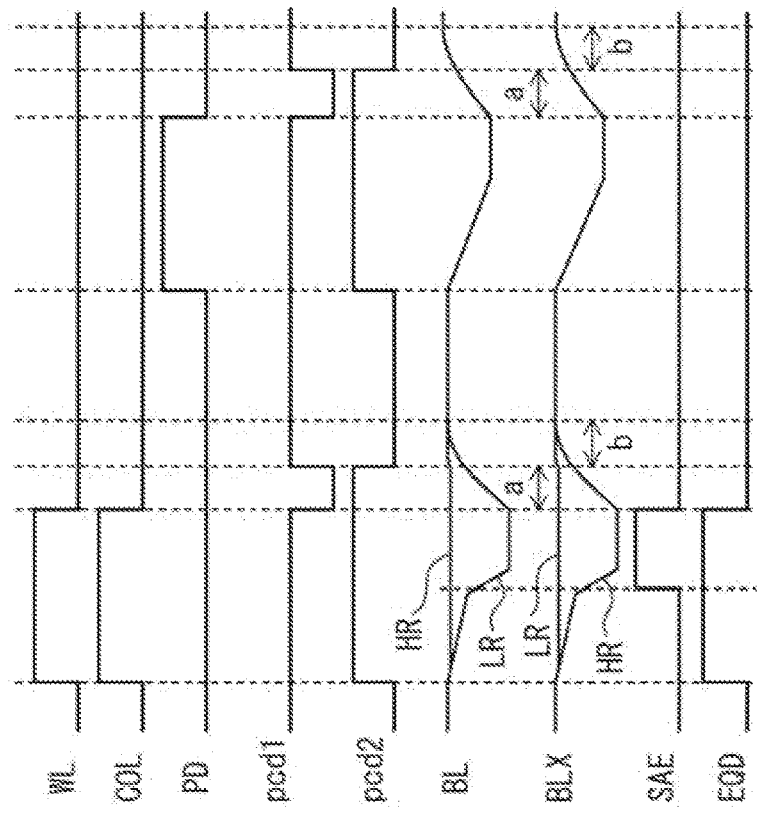

US 9,601,186 B2

BIT LINE PRECHARGING CIRCUIT, STATIC RAM, ELECTRONIC DEVICE, AND STATIC RAM BIT LINE PRECHARGING METHOD

CROSS-REFERENCE TO RELATED APPLICATION

This application is based upon and claims the benefit of priority of the prior Japanese Patent Application No. 2014-251204, filed on Dec. 11, 2014, the entire contents of which are incorporated herein by reference.

FIELD

The technique disclosed herein relates to a bit line precharging circuit, a static RAM (Random Access Memory), an electronic device, and a static RAM bit line precharging method.

BACKGROUND

In recent years, as mobile equipment has developed, a reduction in power source voltage has been sought in order to reduce the power consumption of an LSI. However, the operation lower limit voltage (VDDmin) of the SRAM cannot be lowered because the variation in the threshold value of the memory cell of the SRAM increases due to the miniaturization of an LSI. This prevents further decrease in the power source voltage.

Therefore, a dual rail method has been adopted in which power sources of different voltages are supplied to the memory cell array portion of the SRAM and to the other portion, respectively. An LSI chip mounting a dual-rail SRAM mounts a power source voltage generation circuit configured to generate a first power source that has a first voltage value and which is supplied to the portion other than the memory cell array portion of the SRAM, and a second power source having a second voltage value greater than the first voltage value from the first power source. There is a case where a power source supplied from outside the chip is used as it is as the first power source. The power source voltage generation circuit is implemented by a charge pump or the like. Mounting the power source voltage generation circuit is a factor in increasing the area of the LSI chip.

The dual-rail SRAM has the memory cell array portion and the other circuit portion. The memory cell array portion includes a plurality of word lines, a plurality of bit line pairs, a plurality of memory cells arranged in correspondence to the intersection portions of the plurality of word lines and the plurality of bit line pairs, a plurality of column switch pairs, a sense amplifier, a write amplifier, a bit line precharging circuit, etc. The other circuit portion includes a row decoder, a column decoder, a control circuit, an I/O circuit, etc.

The dual-rail SRAM has a power down (PD) mode in which the supply of power source to the portion other than the memory cell of the memory cell array portion is stopped when the read or write operation is not performed in order to further reduce power consumption.

In the dual-rail SRAM, when the normal operation in which the read operation or write operation is performed ends and when the power down mode ends, a precharging operation to charge a bit line pair BL/BLX, whose level has dropped, to the second voltage value is performed. The power source voltage generation circuit supplies a current to charge the bit line pair BL/BLX to the second voltage value at the time of the precharging operation. At the time of the precharge of the bit line pair BL/BLX, if a sufficient current is not supplied from the power source voltage generation circuit (charge pump circuit), the second voltage value of the second power source will drop. The second power source is also supplied to the memory cell array portion and if the second voltage value drops, there is a possibility that the contents stored in the memory cell will be lost. Consequently, the power source voltage generation circuit (charge pump circuit) is required to have a current supply capacity equal to or higher than a certain level, and therefore, it is not possible to reduce the circuit area.

Related Documents

[Patent Document 1] Japanese Laid Open Patent Publication No. H08-339688
[Patent Document 2] Japanese Laid Open Patent Publication No. H10-55676
[Patent Document 3] Japanese Laid Open Patent Publication No. 2003-16785

SUMMARY

According to a first aspect of embodiments, a bit line precharging circuit includes: a first switch that connects a bit line to a first power source; a second switch that connects the bit line to a second power source whose voltage value is higher than voltage value of the first power source; and a control circuit including a delay element and configured to bring the second switch into conduction after a delay time by the delay element after bringing the first switch into conduction at the time of precharge of the bit line.

According to a second aspect of embodiments, a static RAM includes: a memory cell array portion; and a circuit portion other than the memory cell array portion including a portion that decodes an address signal to the memory cell array portion and generates a control signal, wherein the memory cell array portion includes: a plurality of word lines; a plurality of bit line pairs; a plurality of memory cells provided at intersection parts of the plurality of word lines and the plurality of bit line pairs; a plurality of column switches provided in correspondence to each of the plurality of bit line pairs; and a plurality of bit line precharging circuits configured to charge each of the plurality of bit line pairs, and each of the plurality of bit line precharging circuits includes: a first switch that connects the bit line pair to a first power source; a second switch that connects the bit line pair to a second power source whose voltage value is higher than voltage value of the first power source; and a control circuit including a delay element and configured to bring the second switch into conduction after a delay time by the delay element after bringing the first switch into conduction at the time of precharge of the bit line.

According to a third aspect of embodiments, a static RAM includes: a memory cell array portion; and a circuit portion other than the memory cell array portion including a portion that decodes an address signal to the memory cell array portion and generates a control signal, wherein the memory cell array portion includes: a plurality of word lines; a plurality of bit line pairs; a plurality of memory cells provided at intersection parts of the plurality of word lines and the plurality of bit line pairs; a plurality of column switches provided in correspondence to each of the plurality of bit line pairs; a common bit line pair that is connected in common to the plurality of bit line pairs via the plurality of column switches; and a common bit line precharging circuit configured to charge the common bit line pair, and the common bit line precharging circuit includes: a first switch that connects the bit line pair to a first power source; a second switch that connects the bit line pair to a second power source whose voltage value is higher than voltage value of the first power source; and a control circuit including a delay element and configured to bring the second switch into conduction after a delay time by the delay element after bringing the first switch into conduction at the time of precharge of the bit line.

According to a fourth aspect of embodiments, an electronic device includes: a static RAM; a circuit part other than the static RAM; a first power source that supplies power to a portion other than a memory cell array portion of the static RAM and the circuit part other than the static RAM; and a power source voltage generation circuit configured to generate power whose voltage value is higher than the voltage value of the first power source from power of the first power source and to supply the power to the memory cell array portion of the static RAM, wherein the static RAM includes a bit line precharging circuit including: a first switch that connects a bit line to the first power source; a second switch that connects the bit line to an output of the power source voltage generation circuit; and a control circuit including a delay element and configured to bring the second switch into conduction after a delay time by the delay element after bringing the first switch into conduction at the time of precharge of the bit line.

According to a fifth aspect of embodiments, a static RAM bit line precharging method includes the steps of: charging a bit line to a first voltage value; and charging the bit line to a second voltage value higher than the first voltage value after a first delay time.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 4A is a time chart illustrating the read operation of the dual-rail SRAM;

FIG. 4B is a time chart illustrating the write operation of the dual-rail SRAM;

FIG. 6A is a time chart illustrating the read operation of the dual-rail SRAM of the first embodiment;

FIG. 6B is a time chart illustrating the write operation of the dual-rail SRAM of the first embodiment;

DESCRIPTION OF EMBODIMENTS

Before explaining the static RAM (hereinafter, referred to as SRAM) of an embodiment, a general dual-rail SRAM and an LSI chip mounting the same are explained.

Figure 1:
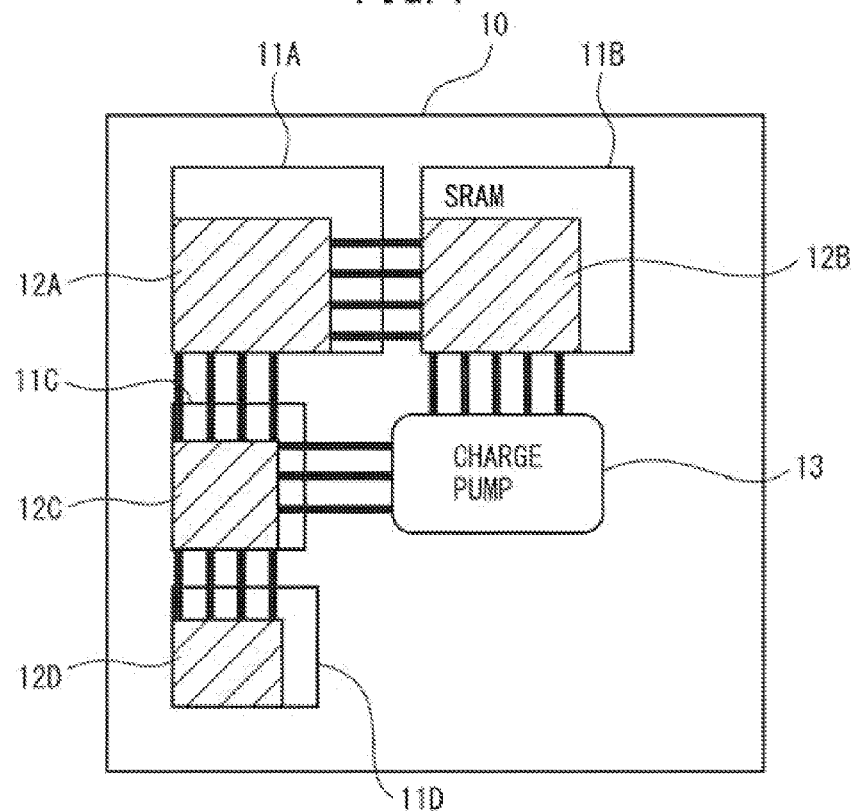
FIG. 1 is a diagram illustrating a configuration example of an LSI chip mounting a dual-rail SRAM.

FIG. 1 is a diagram illustrating a configuration example of an LSI chip mounting a dual-rail SRAM.

An LSI chip 10 has a plurality of SRAMs 11A to 11D and a charge pump 13. In the portion of the LSI chip 10 other than the portion where the SRAMs 11A to 11D are formed, the other circuit portion that makes use of the SRAM is formed. The SRAMs 11A to 11D have memory cell array portions 12A to 12D, respectively. In the portion of the SRAMs 11A to 11D other than the portion where the memory cell array portions 12A to 12D are formed, a row decoder, a column decoder, a control unit, etc., are formed.

The LSI chip 10 has a power source supply net in the form of a mesh, which supplies a normal power source vdd that is supplied from the outside, or the normal power supply vdd that is generated from an external power source by a power source circuit, not illustrated, to the portion other than the memory cell array portions 12A to 12D. In other words, to the other circuit portion of the LSI chip and to the portion of the SRAM other than the memory cell array portions 12A to 12D, the normal power source vdd is supplied.

The charge pump 13 operates as a power source voltage generation circuit configured to generate a charging power source cvdd by stepping up the voltage of the normal power source vdd. The charging power source cvdd that is generated by the charge pump 13 is supplied to the memory cell array portions 12A to 12D of the SRAM. The charging power source cvdd is supplied from the charge pump 13 to the memory cell array portions 12A to 12D through the charging power source supply net indicated by thick lines. For example, the voltage of the normal power source vdd is 0.6 V and the voltage of the charging power source cvdd is 0.95 V. In the following explanation, there is a case where vdd is referred to as the voltage of the normal power source vdd and cvdd as the voltage of the charging power source cvdd.

The circuit portion other than the SRAMs 11A to 11D that are mounted on the LSI chip 10 may be any circuit and for example, in the case of a system on chip (SoC), the circuit may be a processor, an A/D, a D/A, an operation circuit, an input/output circuit, etc. Further, the present invention is also applied, for example, to an SRAM that mounts a charge pump and which supplies a charging power source to the memory cell array portion, not limited to the LSI chip such as this. Furthermore, it is also possible to apply the present invention to an electronic device in which the configuration such as in FIG. 1 is mounted on a board, not limited to the LSI chip.

Figure 2:
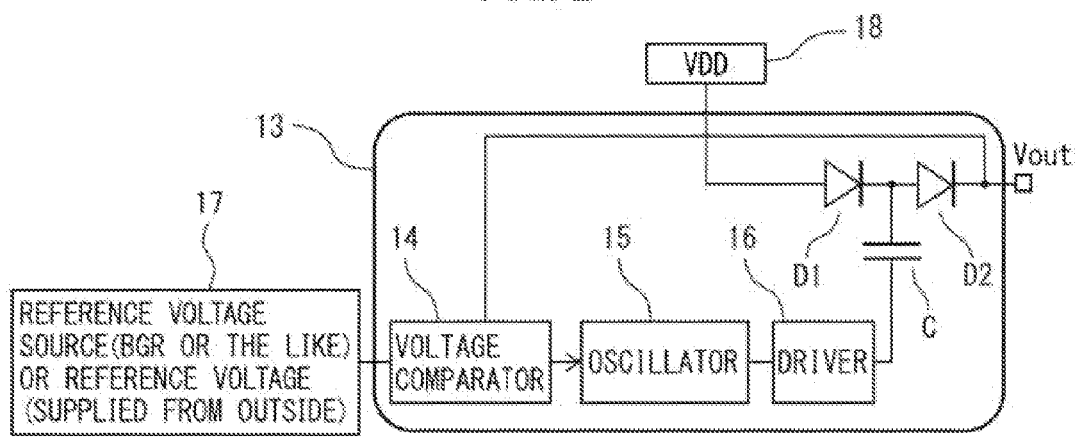
FIG. 2 is a diagram illustrating a configuration example of the charge pump.

FIG. 2 is a diagram illustrating a configuration example of the charge pump 13.

The charge pump 13 has a voltage comparator 14, an oscillator 15, a driver 16, a capacitance element C, and two diodes D1 and D2. The cathode of the diode D1 is connected to a normal power source VDD 18. An oscillation signal that is generated by the oscillator 15 is applied to one of terminals of the capacitance element C by the driver 16. Due to this, the voltage of the other terminal of the capacitance element C fluctuates vertically and when the voltage of the other terminal is lower than the voltage value of the normal power source VDD, a current flows in from D1 and the capacitance element C is charged. By repeating this, the voltage of the other terminal of the capacitance element C is stepped up to a voltage value close to the voltage value, which is the voltage value of the normal power source VDD to which the amplitude of the oscillation signal that is applied to one of the terminals of the capacitance element C is added. The voltage of the other terminal of the capacitance element C is output as an output voltage Vout via the diode D2. The output voltage Vout is the voltage of the charge power source. The voltage comparator 14 compares the output voltage Vout with a reference voltage generated by a reference voltage source that makes use of a BGR (Back Gate Resistor) or the like provided in the LSI chip 10, or a reference voltage that is supplied from the outside, and controls the oscillation of the oscillator 15 so that Vout is a fixed value. The circuit configuration and operation of the charge pump are widely known, and therefore, more explanation is omitted.

The power (current) that the charge pump 13 can supply is determined by the drive force of the driver 16 of the charge pump 13, the capacitance of the capacitance element C, and the amount of current of the diodes D1 and D2. Therefore, if the power that the charge pump 13 supplies is increased, the area of the charge pump 13 increases.

The SRAM has the memory cell array portion and the other circuit portion. The memory cell array portion has a plurality of word lines and a plurality of bit line pairs formed into the shape of a grating, a plurality of memory cells, a plurality of bit line precharging/power down circuits, a plurality of column switches, a common bit line pair, an equalizing circuit, a sense amplifier, a write amplifier, etc. The plurality of memory cells is provided at the intersection parts of the plurality of word lines and the plurality of bit line pairs, and the plurality of column switches and the plurality of bit line precharging circuits are provided in correspondence to the plurality of bit line pairs, respectively. The plurality of column switches selectively connects the plurality of bit line pairs to the common bit line pair in accordance with a column selection signal. The plurality of bit line precharging circuits performs a precharging operation to charge each of the plurality of bit line pairs. The equalizing circuit, the sense amplifier, and the write amplifier are connected to the common bit line pair. The equalizing circuit precharges the common bit line pair to cvdd. The sense amplifier amplifies the potential difference between the bit line pair that has changed in accordance with the data of the accessed memory cell and the common bit line pair at the time of read, and outputs the amplified potential difference to the input/output circuit. The write amplifier brings the common bit line pair and the bit line pair into a state in accordance with the data to be written to the memory cell that is to be accessed at the time of write.

The other circuit portion of the SRAM has a row decoder, a column decoder, an input/output circuit, a control circuit, etc. The row decoder decodes an address signal and generates a word line selection signal WL to be applied to the word line. The column decoder decodes the address signal and generates a column selection signal co1 to select a column switch to be brought into conduction. The control circuit generates a power down signal PD, an equalizing signal EQD, a sense amplifier starting signal SAE, a write amplifier signal, etc. To the write amplifier, a signal corresponding to the data to be written is applied.

The configuration and operation of the SRAM are widely known, and therefore, more explanation is omitted.

Figure 3:
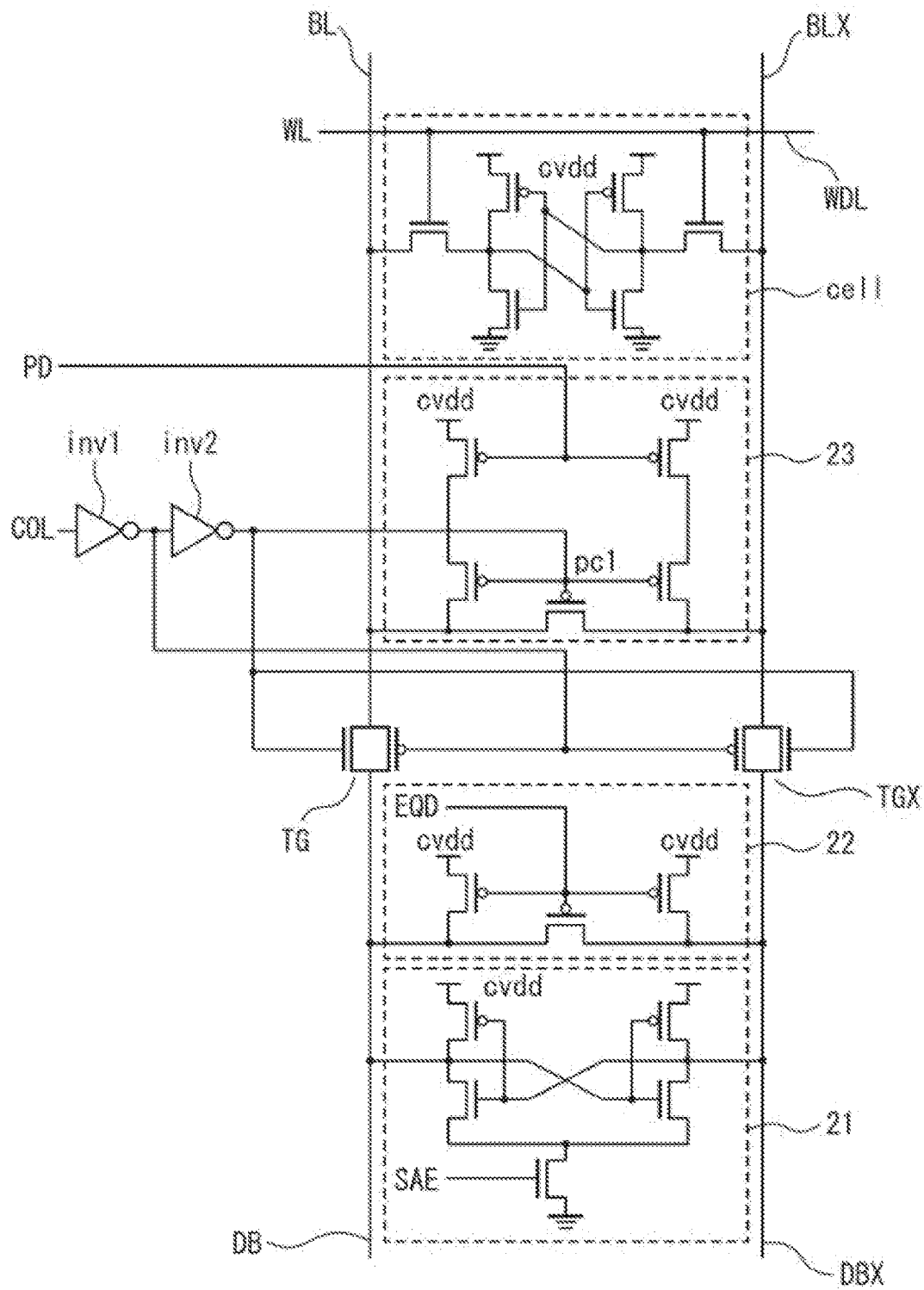
FIG. 3 is a diagram illustrating a circuit configuration of one memory cell of a general dual-rail SRAM, and a word line, a bit line pair, a bit line precharging/power down circuit, a column switch, a common bit line pair, an equalizing circuit, and a sense amplifier accompanying the memory cell.

FIG. 3 is a diagram illustrating a circuit configuration of one memory cell of a general dual-rail SRAM, and a word line, a bit line pair, a bit line precharging/power down circuit, a column switch, a common bit line pair, an equalizing circuit, and a sense amplifier accompanying the memory cell.

As described above, the SRAM has a memory cell array including a plurality of word lines, a plurality of bit lines pairs, and a plurality of memory cells and it is common for the SRAM to further have a plurality of blocks of such a memory cell array. FIG. 3 illustrates only the portion related to the memory cell and the write amplifier is omitted.

A memory cell (cell) is arranged in correspondence to the intersection portion of a word line WDL and the bit line pair BL and BLX, and the gate of a connection transistor of the memory cell is connected to the word line WDL and the terminal to be controlled (drain or source) is connected to the bit line pair BL and BLX. To the bit line pair BL and BLX, a bit line precharging/power down circuit 23 is further connected.

The bit line pair BL and BLX is connected to a common bit line pair DB and DBX via column switches TG and TGX. To the common bit line pair DB and DBX, another bit line pair BL and BLX, not illustrated, provided in parallel to the bit line pair BL and BLX is connected via the column switches. To the common bit line pair DB and DBX, a sense amplifier 21 and an equalizing circuit 22 are connected.

To the power sources of the memory cell, the sense amplifier 21, the equalizing circuit 22, and the bit line precharging/power down circuit 23, the charging power source cvdd is supplied.

FIG. 4A and FIG. 4B are time charts illustrating the operations of the dual-rail SRAM, and FIG. 4A illustrates a read operation and FIG. 4B illustrates a write operation. FIG. 4A and FIG. 4B also illustrate the operation at the time of power down.

At the time of the read operation and the write operation, the power down signal PD is turned to the low (L) level. At the time of the read operation, the word line selection signal WL, the column selection signal COL, and the equalizing signal EQD of the memory cell to be accessed change from the L level to the high (H) level. In response to this, the equalizing circuit 22 turns off, pc1 changes to the H level, the bit line pair BL and BLX is shut off from each other, the connection transistor of the memory cell is brought into conduction, and the state where the terminal of the memory cell is connected to the bit line pair BL and BLX is brought about. Due to this, the bit line pair BL and BLX changes toward the state in accordance with the stored data of the memory cell, i.e., one of the bit line pair BL and BLX changes toward the H level and the other changes toward the L level, and further, the column switches TD and TDX are brought into conduction and a potential difference in accordance with the stored data is generated between the common bit line pair DB and DBX. At this point in time, SAE changes to the H level, the sense amplifier 21 starts its operation, the potential difference between the bit line pair BL and BLX and that between the common bit line pair DB and DBX are amplified and the state in accordance with the stored data is brought about. In FIG. 4A, the change of the bit lines BL and BLX when stored data "H" is read is indicated by HR and the change of the bit lines BL and BLX when stored data "L" is read is indicated by LR. In FIG. 4B, the change of the bit lines BL and BLX when the stored data "H" is written is indicated by HW and the change of the bit lines BL and BLX when the stored data "L" is written is indicated by LW.

Next, the word line selection signal WL, the column selection signal COL, the equalizing signal EQD, and SAE change from the H level to the L level. In response to this, the memory cell is cut off from the bit line pair, the column switches TD and TDX are shut off, and pc1 changes to the L level. Then, the sense amplifier 21 turns off and the equalizing circuit 22 and the bit line precharging/power down circuit 23 turn on. Due to this, as illustrated by a circle drawn by a broken line in FIG. 4A, one of the bit line pair BL and BLX is precharged to the H level, and one of the common bit line pair DB and DBX is also precharged to the H level. The power for this precharge is supplied from the charging power source cvdd that is generated by the charge pump 13.

The write operation differs from the read operation in that the write amplifier is activated instead of that SAE turns to the H level and the sense amplifier 21 is activated, and the common bit line pair DB and DBX and the bit line pair BL and BLX are set to the state in accordance with the data to be written. In response to this, the memory cell enters the state in accordance with the data to be written and the write operation is completed. After the write operation is completed, the equalizing circuit 22 and the bit line precharging/power down circuit 23 also turn on and as illustrated by a circle drawn by a broken line in FIG. 4B, one of the bit line pair BL and BLX is precharged to the H level. One of the common bit line pair DB and DBX is also precharged to the H level. The power for this precharge is supplied from the charging power source cvdd that is generated by the charge pump 13.

A power down mode is provided in which power consumption is reduced when the SRAM is not used. In order to enter the power down mode, PD is turned to the H level. At this time, WL, COL, EQD, and pc1 are at the L level. By turning PD to the H level, the charging power source cvdd is no longer supplied to the bit line precharging/power down circuit 23, the potential of the bit line pair BL and BLX drops gradually and reaches the L level. At this time, the supply of the charging power source cvdd to the memory cell is maintained, and therefore, it is unlikely that the stored data of the memory cell is damaged.

When the power down mode is terminated by turning PD to the L level, as illustrated by the circles drawn by the broken line in FIG. 4A and FIG. 4B, the bit line pair BL and BLX and the common bit line pair DB and DBX are also precharged to the H level. The power for this precharge is supplied from the charging power source cvdd that is generated by the charge pump 13.

In the precharge, the plurality of bit line pairs BL and BLX on the memory cell array and the common bit line pair DB and DBX are precharged to the H level at the same time, and therefore, if the capacity to supply the charging power source cvdd of the charge pump 13 is low, there is a possibility that the charging power source cvdd will drop temporarily. The charging power source cvdd is also a power source necessary to hold the data of the memory cell, and therefore, if the charging power source cvdd drops, there is a possibility that the data held in the memory cell will be lost. In order to prevent the charging power source cvdd from dropping, the power supplied by the charge pump 13 is increased, i.e., the area of the charge pump 13 is increased. Therefore, the dual-rail SRAM has such a problem that it is difficult to reduce the area while maintaining the reliability of the data held in the memory cell.

In an embodiment described below, a dual-rail SRAM whose area has been reduced while maintaining the operation speed is disclosed.

Figure 5:
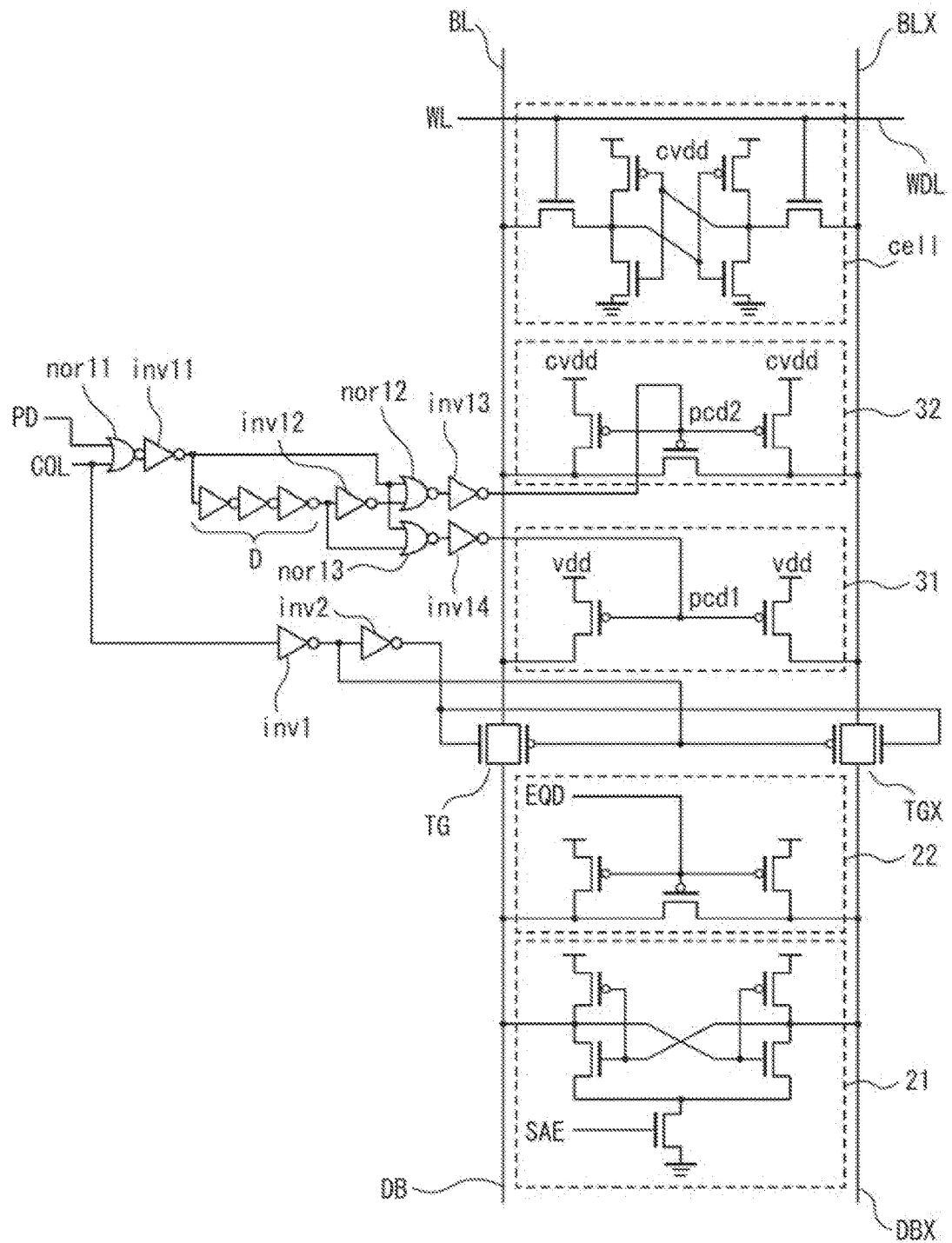
FIG. 5 is a diagram illustrating a circuit configuration of one memory cell of a dual-rail SRAM of a first embodiment and components accompanying the one memory cell.

FIG. 5 is a diagram illustrating a circuit configuration of one memory cell of a dual-rail SRAM of a first embodiment and components accompanying the memory cell. FIG. 5 is a diagram corresponding to FIG. 3 and the same reference symbols are attached to the same components and explanation of the same components is omitted.

The dual-rail SRAM of the first embodiment differs from the SRAM in FIG. 3 in that a first bit line precharging/power down circuit 31 and a second bit line precharging/power down circuit 32 are provided in place of the bit line precharging/power down circuit 23. Further, the dual-rail SRAM of the first embodiment has a control circuit configured to generate first and second precharging/power down signals pcd1 and pcd2 from the column selection signal COL and the power down signal PD. The first precharging/power down signal pcd1 controls the first bit line precharging/power down circuit 31 and the second precharging/power down signal pcd2 controls the second bit line precharging/power down circuit 32.

The first bit line precharging/power down circuit 31 is a circuit configured to charge (precharge) the bit line pair BL and BLX to the normal power source vdd and to operate when pcd1 is at the L level and stop its operation when pcd1 is at the H level. The second bit line precharging/power down circuit 32 is a circuit configured to charge (precharge) the bit line pair BL and BLX to the charging power source cvdd and to operate when pcd2 is at the L level and stop its operation when pcd2 is at the H level.

The control circuit has three NOR gates nor11 to 13, four inverters inv11 to 14, and an inverse delay line D in which three inverters are connected in series. The control circuit turns pcd1 and pcd2 to the H level when COL or PD is at the H level (COL and PD do not turn to the H level at the same time). The control circuit further turns pcd1 to the H level and pcd2 to the L level when both COL and PD are at the L level. Then, when the state where one of COL and PD is at the H level changes into the state where both are at the L level, the control circuit maintains pcd1 at the L level and pcd2 at the H level for a predetermined period of time and after the predetermined period of time, the control circuit changes pcd1 to the H level and pcd2 to the L level.

FIG. 6A and FIG. 6B are time charts illustrating the operation of the dual-rail SRAM of the first embodiment, and FIG. 6A illustrates the read operation and FIG. 6B illustrates the write operation. FIG. 6A and FIG. 6B also illustrate the operation at the time of power down. FIG. 6A and FIG. 6B are diagrams corresponding to FIG. 4A and FIG. 4B, but the operation when COL changes from the H level to the L level and the operation when PD changes from the H level to the L level are different.

As illustrated in FIG. 6A and FIG. 6B, when COL changes from the H level to the L level, pcd1 turns to the L level for a period of time indicated by a and the H level of pcd2 is maintained. Due to this, the first bit line precharging/power down circuit 31 turns on and the bit line pair BL and BLX is charged (precharged) to the potential of the normal power source vdd. The length of the period of time a corresponds to the amount of delay of the inverse delay line D of the control circuit in FIG. 5.

When the period of time a elapses, pcd1 changes to the H level and pcd2 changes to the L level. Due to this, the first bit line precharging/power down circuit 31 turns off, the second bit line precharging/power down circuit 32 turns on, and for a period of time indicated by b, the bit line pair BL and BLX is charged (precharged) to the potential of the charging power source cvdd. After the period of time b, this state is maintained until COL or PD changes to the H level.

When PD changes from the H level to the L level, the bit line pair BL and BLX is also precharged to vdd similarly for the period of time a and then is precharged to cvdd.

As explained above, in the first embodiment, the bit line pair BL and BLX is precharged in two stages, i.e., in the stage in which the bit line pair BL and BLX is precharged to vdd and in the stage in which the bit line pair BL and BLX is precharged from vdd to cvdd. For the precharge to vdd, the normal power source is used, and therefore, the output of the charging pump 13 is not used, but the output of the charge pump 13 is used for the precharge from vdd to cvdd. Consequently, in the first embodiment, it is possible to reduce the load of the charge pump 13 compared to the case where the precharge is performed by using only the output of the charge pump 13, and therefore, it is possible to use the charge pump 13 having a low power (current) supply capacity. Consequently, it is possible to reduce the area of the LSI chip 10 by reducing the area of the charge pump 13.

Figure 7:
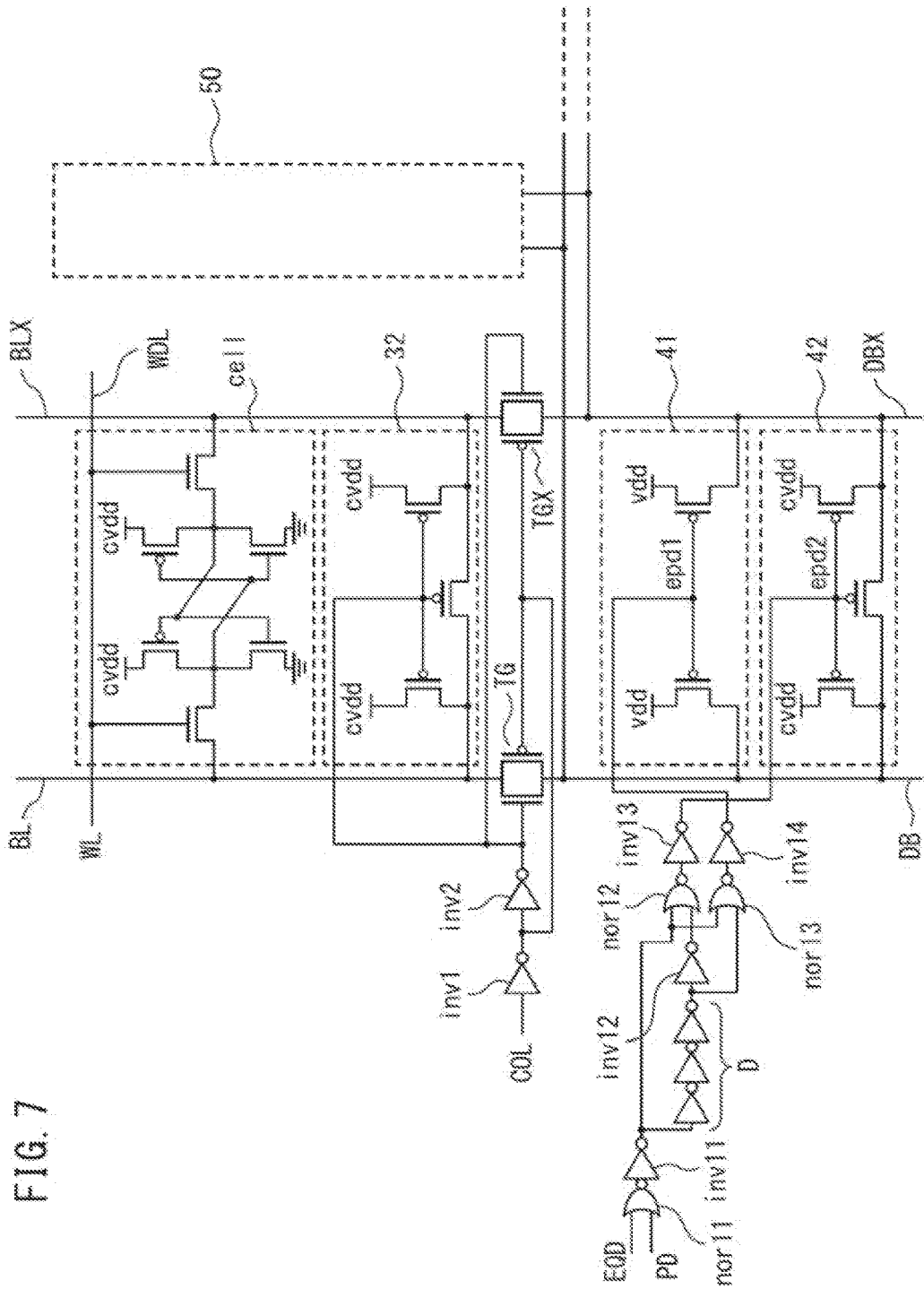
FIG. 7 is a diagram illustrating a circuit configuration of one memory cell of a dual-rail SRAM of a second embodiment and components accompanying the memory cell.

FIG. 7 is a diagram illustrating a circuit configuration of one memory cell of a dual-rail SRAM of a second embodiment and components accompanying the memory cell. FIG. 7 is a diagram corresponding to FIG. 5 and the same reference symbols are attached to the same components and explanation of the same components is omitted.

The second embodiment differs from the first embodiment in removing the first bit line precharging/power down circuit 31 and in providing first and second bit line equalizing/power down circuits 41 and 42 in place of the equalizing circuit 22. In FIG. 7, the schematic representation of the sense amplifier is omitted. Further, in the second embodiment, the control circuit generates first and second equalizing/power down signals epd1 and epd2 from the power down signal PD and the equalizing signal EQD. The first equalizing/power down signal epd1 controls the first equalizing/power down circuit 41 and the second equalizing/power down signal epd2 controls the second equalizing/power down circuit 42. Further, in the second embodiment, the second bit line precharging/power down circuit 32 is controlled by a signal corresponding to the column selection signal.

As described previously, the SRAM has the plurality of word lines and the plurality of bit line pairs. Here, a circuit corresponding to each bit line pair is referred to as a column 50. Consequently, each column 50 has the plurality of memory cells cell, the column switches TG and TGX, and the second bit line precharging/power down circuit 32. The bit line pair BL and BLX of each column 50 is connected to the common bit line pair DB and DBX via the column switches TG and TGX.

Figure 8A:
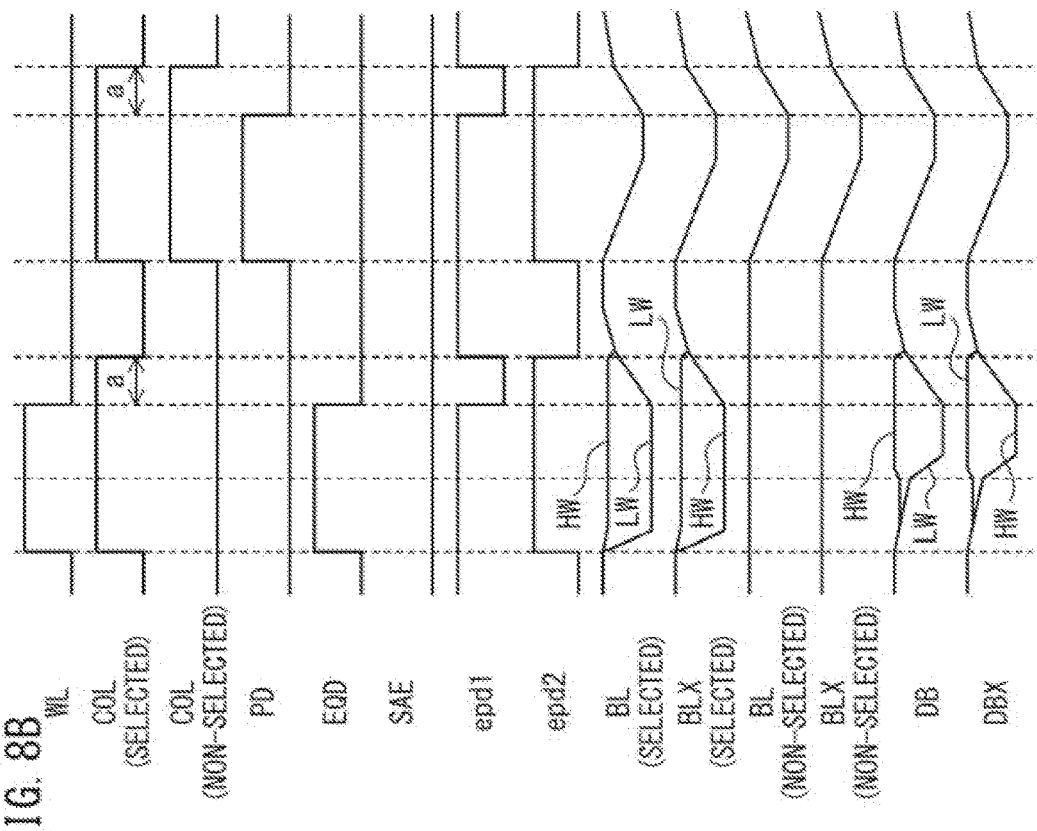
FIG. 8A is a time chart illustrating the read operation of the dual-rail SRAM of the second embodiment.
Figure 8B:
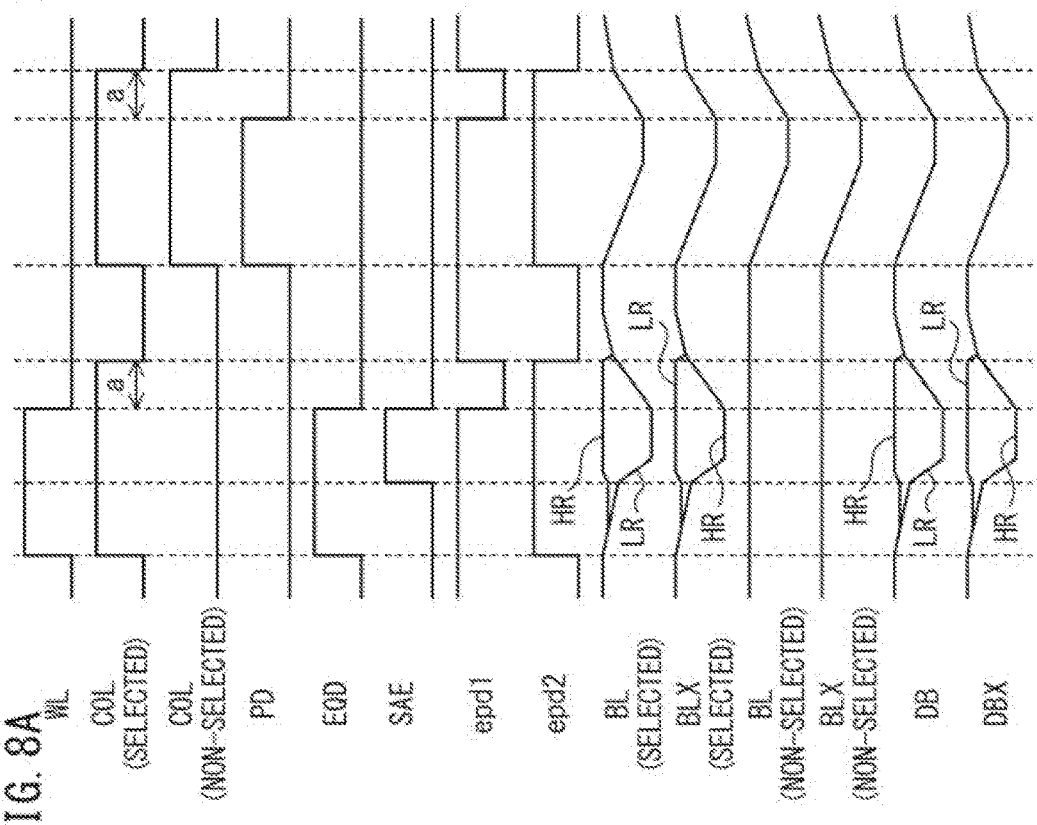
FIG. 8B is a time chart illustrating the write operation of the dual-rail SRAM of the second embodiment.

FIG. 8A and FIG. 8B are time charts illustrating the operation of the dual-rail SRAM of the second embodiment, and FIG. 8A illustrates the read operation and FIG. 8B illustrates the write operation. FIG. 8A and FIG. 8B also illustrate the operation at the time of power down. FIG. 8A and FIG. 8B are diagrams corresponding to FIG. 6A and FIG. 6B, but FIG. 8A and FIG. 8B differ from FIG. 6A and FIG. 6B in that the precharge in the first stage is performed by the first equalizing/power down circuit 41 and at this time, COL changes from the H level to the L level in a delayed manner.

As illustrated in FIG. 8A and FIG. 8B, as in the first embodiment, the selected WL, COL, and EQD turn to the H level and the read operation and the write operation are performed. In the diagrams, only the selected WL is illustrated. After the read operation and the write operation end and WL and EQD change from the H level to the L level, COL is maintained at the H level for the period of time a and the column switches TG and TGX are in the conduction state. PD is at the L level and EQD changes from the H level to the L level, and therefore, epd1 remains at the L level for the period of time a, the first equalizing/power down circuit 41 turns on, and the common bit line pair DB and DBX and the bit line pair BL and BLX are precharged to vdd. After the period of time a ends, COL changes to the L level, epd1 changes to the H level, and epd2 changes to the L level. Due to this, the column switches TG and TGX are shut off, the first equalizing/power down circuit 41 turns off, and the second bit line precharging/power down circuit 32 and the second equalizing/power down circuit 42 turn on. Due to this, the selected column enters a non-selected state and the bit line pair BL and BLX is precharged to cvdd by the second bit line precharging/power down circuit 32. The common bit line pair DB and DBX is precharged to cvdd by the second equalizing/power down circuit 42. During the above read operation and write operation, the non-selected column is shut off and the bit line pair BL and BLX is maintained in the state of being precharged to cvdd.

At the time of the power down mode, all of the column selection signals COL turn to the H level together with PD, the column switches TG and TGX of all the columns 50 are brought into conduction, and all the bit line pairs BL and BLX are connected to the common bit line pair DB and DBX. After PD turns to the L level and the power down mode ends, all COLs maintain the H level for the period of time a. Due to this, similar to the above, the first equalizing/power down circuit 41 turns on and the common bit line pair DB and DBX and all the bit line pairs BL and BLX are precharged to vdd. After the period of time a ends, COL changes to the L level and the bit line pair BL and BLX of each column is precharged to cvdd by the second bit line precharging/power down circuit 32. Further, the common bit line pair DB and DBX is precharged to cvdd by the second equalizing/power down circuit 42.

As above, in the second embodiment, as in the first embodiment, the precharge is performed in the two stages, i.e., the first stage in which the precharge is performed until vdd is reached and the second stage in which the precharge is performed until cvdd is reached after the first stage. Consequently, it is possible to use the charge pump 13 having a low power (current) supply capacity, and therefore, it is possible to reduce the area of the LSI chip 10 by reducing the area of the charge pump 13. Further, the function of the first bit line precharging/power down circuit 31 provided for each column in the first embodiment is performed by the first equalizing/power down circuit 41 provided in the common bit line pair, and therefore, it is possible to reduce the area.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A bit line precharging circuit comprising:
 a first switch having one terminal connected to a bit line and having another terminal connected to a first power source;

a second switch having one terminal connected to the bit line and having another terminal connected to a second power source whose voltage value is higher than a voltage value of the first power source; and
a control circuit including a delay element, in response to a column selection signal and a power down signal, configured to bring the second switch into conduction after a delay time by the delay element after bringing the first switch into conduction at the time of precharge of the bit line.

2. A static RAM comprising:
a memory cell array portion; and
a circuit portion other than the memory cell array portion including a portion that decodes an address signal to the memory cell array portion and generates a control signal, wherein
the memory cell array portion includes:
   a plurality of word lines;
   a plurality of bit line pairs;
   a plurality of memory cells provided at intersection parts of the plurality of word lines and the plurality of bit line pairs;
   a plurality of column switches provided in correspondence to each of the plurality of bit line pairs; and
   a plurality of bit line precharging circuits configured to charge each of the plurality of bit line pairs, and
each of the plurality of bit line precharging circuits includes:
   a first switch having one terminal connected to the bit line pair and having another terminal connected to a first power source;
   a second switch having one terminal connected to the bit line pair and having another terminal connected to a second power source whose voltage value is higher than a voltage value of the first power source; and
   a control circuit including a delay element, in response to a column selection signal and a power down signal, configured to bring the second switch into conduction after a delay time by the delay element after bringing the first switch into conduction at the time of precharge of the bit line.

3. A static RAM comprising:
a memory cell array portion; and
a circuit portion other than the memory cell array portion including a portion that decodes an address signal to the memory cell array portion and generates a control signal, wherein
the memory cell array portion includes:
   a plurality of word lines;
   a plurality of bit line pairs;
   a plurality of memory cells provided at intersection parts of the plurality of word lines and the plurality of bit line pairs;
   a plurality of column switches provided in correspondence to each of the plurality of bit line pairs;
   a common bit line pair that is connected in common to the plurality of bit line pairs via the plurality of column switches; and
   a common bit line precharging circuit configured to charge the common bit line pair, and
the common bit line precharging circuit includes:
   a first switch having one terminal connected to a bit line and having another terminal connected to a first power source;
   a second switch having one terminal connected to the bit line and having another terminal connected to a second power source whose voltage value is higher than a voltage value of the first power source; and
   a control circuit including a delay element, in response to a column selection signal and a power down signal, configured to bring the second switch into conduction after a delay time by the delay element after bringing the first switch into conduction at the time of precharge of the bit line.

4. The static RAM according to claim 3, further comprising a plurality of bit line precharging circuits configured to connect each of the plurality of bit line pairs to the second power source.

5. The static RAM according to claim 3, further comprising a plurality of bit line precharging circuits configured to connect each of the plurality of bit line pairs to the second power source.

6. An electronic device comprising:
a static RAM;
a circuit part other than the static RAM;
a first power source that supplies power to a portion other than a memory cell array portion of the static RAM and the circuit part other than the static RAM; and
a power source voltage generation circuit configured to generate power whose voltage value is higher than the voltage value of the first power source from power of the first power source and to supply the power to the memory cell array portion of the static RAM, wherein
the static RAM includes a bit line precharging circuit including:
   a first switch that connects a bit line to a the first power source;
   a second switch that connects the bit line to a second power source voltage value is higher than voltage value of the first power source; and
   a control circuit including a delay element, in response to a column selection signal and a power down signal, configured to bring the second switch into conduction after a delay time by the delay element after bringing the first switch into conduction at the time of precharge of the bit line.

7. A static RAM bit line precharging method comprising the steps of:
charging a bit line, in response to a column selection signal, to a first voltage value by switching a first switch having one terminal connected to a bit line and having another terminal connected to a first power source; and
charging the bit line, in response to a power down signal, to a second voltage value higher than the first voltage value after a first delay time by switching a second switch having one terminal connected to the bit line and having another terminal connected to a second power source whose voltage value is higher than a voltage value of the first power source.

8. A bit line precharging circuit comprising:
a first switch having one terminal connected to a bit line and having another terminal connected to a first power source;
a second switch having one terminal connected to the bit line and having another terminal connected to a second power source whose voltage value is higher than a voltage value of the first power source; and
a control circuit including a delay element, in response to an equalizing signal and a power down signal, and configured to bring the second switch into conduction after a delay time by the delay element after bringing the first switch into conduction at the time of precharge of the bit line.

\* \* \* \* \*